United States Patent [19]

Thompson

[11] Patent Number: 5,274,375
[45] Date of Patent: Dec. 28, 1993

[54] DELTA-SIGMA MODULATOR FOR AN ANALOG-TO-DIGITAL CONVERTER WITH LOW THERMAL NOISE PERFORMANCE

[75] Inventor: Charles D. Thompson, Austin, Tex.

[73] Assignee: Crystal Semiconductor Corporation, Austin, Tex.

[21] Appl. No.: 870,059

[22] Filed: Apr. 17, 1992

[51] Int. Cl.⁵ ............................................. H03M 3/00
[52] U.S. Cl. .................................. 341/143; 341/118
[58] Field of Search .............................. 341/118, 143

[56] References Cited

U.S. PATENT DOCUMENTS

| | | | |
|---|---|---|---|
| 4,227,185 | 10/1980 | Kronlage | 340/341 |
| 4,495,591 | 1/1985 | Loomis, Jr. | 364/724 |
| 4,599,573 | 7/1986 | Senderowicz | 330/107 |
| 4,887,085 | 12/1989 | Moyal | 341/169 |
| 4,896,155 | 1/1990 | Craiglow | 341/120 |
| 4,940,981 | 7/1990 | Naylor et al. | 341/161 |
| 4,972,189 | 11/1990 | Polito et al. | 341/118 |
| 4,972,436 | 11/1990 | Halim et al. | 375/28 |
| 4,999,632 | 3/1991 | Parks | 341/167 |
| 5,010,347 | 4/1991 | Yukawa | 341/143 |
| 5,012,178 | 4/1991 | Weiss et al. | 323/269 |
| 5,068,659 | 11/1991 | Sakaguchi | 341/143 |
| 5,079,550 | 1/1992 | Sooch et al. | 341/143 |
| 5,084,702 | 1/1992 | Ribner | 341/143 |
| 5,162,801 | 11/1992 | Powell et al. | 341/150 |

OTHER PUBLICATIONS

"Improved Signal-to-Noise Ratio Using Tri-Level Delta-Sigma Modulation" by John J. Paulos, Gregory T. Brauns, Michael B. Steer, Sasan H. Ardalan, *IEEE Proc. ISCAS*, May 1987, pp. 463–466.

"Design and Implementation of an Audio 18-Bit Analog-to-Digital Converter Using Oversampling Techniques" by Robert W. Adams, *J. Audio Eng. Soc.*, vol. 34, pp. 156–166, Mar. 1986.

"Circuit and Technology Considerations for MOS Delta-Sigma A/D Converters" by Max W. Hauser and Robert W. Brodersen, *IEEE Proc. ISCAS '86*, pp. 1310–1315, May 1986.

"Multibit Oversampled Σ-Δ A/D Convertor with Digital Error Correction" by L. E. Larson, T. Cataltepe, and G. C. Temes, *Electron. Lett.*, vol. 24, pp. 1041–1052, Aug. 1988.

"A Noise-Shaping Coder Topology for 15+ Bit Converters" by L. Richard Carley, *IEEE J. Solid-State Circuits*, vol. SC-24, pp. 267–273, Apr. 1989.

"Adaptive Selfcalibrating Delta-Sigma Modulators" by S. Abdennadher, S. Kiaei, G. Temes and R. Schreier, *Electronics Letters*, Jul. 2, 1992, vol. 28, No. 14.

"On-Line Adaptive Digital Correction of Dual-Quantisation Delta-Sigma Modulators" by Yaohua Yang, R. Schreier, G. C. Temes and S. Kiaei, *Electronics Letters*, Jul. 30, 1992, vol. 28, No. 16.

*Primary Examiner*—Marc S. Hoff
*Attorney, Agent, or Firm*—Gregory M. Howison

[57] ABSTRACT

An analog-to-digital converter includes a two-bit delta-sigma modulator. The delta-sigma modulator is comprised of a first stage integrator (10) that feeds a noise shaping circuit (18). The output of the noise shaping circuit (18) is input to a two-threshold imbedded ADC (20) to provide the two-bit output. This output of the imbedded ADC (20) is input to a digital filter (22) to provide the filtered digital output, this filtering high-frequency noise. The output of the imbedded ADC (20) is also fed back through a three-level DAC (24) to a summing junction on the input of the integrator (10). The three-level DAC 24 has three states that are output with one state being a "do nothing" state. The thermal noise performance of the delta-sigma modulator as a function of the quantizer threshold voltages is first simulated and then the value of the quantizer thresholds selected to provide optimum signal-to-thermal noise performance.

28 Claims, 4 Drawing Sheets

DELTA-SIGMA MODULATOR FOR AN ANALOG-TO-DIGITAL CONVERTER WITH LOW THERMAL NOISE PERFORMANCE

TECHNICAL FIELD OF THE INVENTION

The present invention pertains in general to analog-to-digital converters and, more particularly, to the thermal noise performance of the delta-sigma modulator in an analog-to-digital converter.

CROSS REFERENCE TO RELATED APPLICATION

This application is related to U.S. patent application Ser. No. 07/870,270, entitled "Method and Apparatus for Calibrating a Multi-Bit Delta-Sigma Modulator" filed concurrently herewith.

BACKGROUND OF THE INVENTION

The noise performance of an analog-to-digital converter is determined in part by the noise performance of the analog modulator. In the case of a delta-sigma analog modulator, this noise can be of two types, the quantization noise and the thermal noise, which noise is a function of the architecture, filtering, etc., of the modulator. This is especially exhibited in the noise differences between multi-bit and single-bit modulators. Multi-bit delta-sigma modulators provide some advantages in quantization noise performance due their ability to increase resolution in the DAC portion of the modulator. The addition of an extra bit of resolution in the feedback DAC reduces quantization noise by 6 dB. Delta-sigma modulators are often designed to minimize quantization noise within some frequency band of interest. This minimization anticipates that a subsequent digital filter section will remove quantization noise outside the frequency band of interest.

The order of a delta-sigma modulator controls the amount of quantization noise that appears in a frequency band of interest. A modulator of order L will improve the signal-to-noise ratio by (6 L+3) dB for each doubling of the sampling frequency. For this reason, increasing modulator order has been recognized as a more efficient method of improving the dynamic range of a delta-sigma modulator than increasing the resolution of the DAC portion thereof.

One inherent disadvantage to a multi-bit delta-sigma modulator is the need to correct for non-idealities in a DAC having greater than two output levels. Correction for these non-idealities is discussed in Catalepe et. al., "Digitally Corrected Multi-Bit Sigma-Delta Data Converters", *IEEE Proceedings ISCAS '89*, May 1989 and Carley, "A Noise-Shaping Coder Topology for 15+Bit Converters", *IEEE J. Solid-State Circuits*, SC-24, April 1989.

The primary problems that are being addressed by researchers in the delta-sigma analog-to-digital converter field include the reduction of in-band quantization noise and the production of a stable modulator. For the most part, practical delta-sigma modulators often have relatively little quantization noise within their frequency band of interest, as their noise is dominated by thermal noise sources at the converter input, which normally comprises a switched-capacitor integrator. The noise limits of the switched-capacitor integrators are discussed in Hauser, M. W. and Brodersen, R. W., "Circuits and Technology Considerations for MOS Delta-Sigma A/D Converters", *IEEE Proceedings ISCAS '86*, May 1986, pp. 1310–1315.

In conventional delta-sigma converters having a bi-level output, the feedback DAC consists of a capacitor $C_1$ and appropriate switches. The converter's optimal mean-square equivalent input noise current is given by:

$$i^2_{EQ} = 2kTC_1 f_s^2 \frac{f_B}{f_S/2} \quad (1)$$
$$= 4kTC_1 f_S f_B$$

Note that $i^2_{EQ}$ increases linearly with the value of $C_1$. Here $f_s$ is the modulator sampling frequency, $f_B$ is the bandwidth of interest, k is Boltzmann's constant, and T is the absolute temperature.

One type of multi-level delta-sigma modulator using a tri-level DAC is described in Paulos, "Improved Signal-to-Noise Ratio Using Tri-level Delta-Sigma Modulation", *IEEE Proc. ISCAS '87*, May 1987, pp. 436–466. In this type of structure, a "do nothing" state is provided such that a large percentage of sampling periods, no charge is delivered to the input node. The "do nothing" state results in lower quantization noise and provides some thermal noise advantages as well. The reason for this is that noise is only added to the modulator when $C_1$ is switched. If the term $\beta$ denotes the probability of occurrence of the "do nothing" state, the equivalent input noise current is given by:

$$i_{EQ}^2 = (1-\beta)4kTC_1 f_S f_B \quad (2)$$

It can be seen therefore that the tri-level system reduces the effective value of $C_1$ some of the time (when compared to a bi-level system).

The $kTC_1$ noise is the dominant thermal noise source in a properly designed delta-sigma converter. However, it should be understood that there are numerous other thermal noise sources that can impact the performance of high order delta-sigma modulators.

Once the loop filter parameters of the delta-sigma modulator are chosen, the values for the reference voltages on the quantizer in the tri-level system are selected to optimize in-band quantization noise. This provides a noise advantage but it does not directly address the thermal noise problems which tend to dominate the noise considerations in high order delta-sigma modulators. Therefore, there exists a need to address the thermal noise considerations of multi-level delta-sigma modulators utilizing multi-level DACs in the feedback path.

SUMMARY OF THE INVENTION

The present invention disclosed and claimed herein comprises a method for reducing the thermal noise of a delta-sigma modulator. The delta-sigma modulator includes a loop filter which processes the difference between the input signal and a feedback DAC signal to provide a filtered voltage. The output of the loop filter is input to an m-level quantizer having m-1 quantizer threshold voltages. The output of the quantizer is input to a digital filter to provide the filtered output of the analog-to-digital converter. The output of the quantizer is also input to an m-level DAC the output of which provides the feedback DAC signal. The overall delta-sigma modulator has a signal-to-thermal noise ratio that is a function of the quantizer threshold voltages. The thermal noise characteristics of the delta-sigma modulator are optimized by selecting values for the quantizer threshold voltages that result in an optimum signal-to-thermal noise ratio. These voltages are input to the threshold voltage inputs of the m-level quantizer.

In another aspect of the present invention, the value of m is equal to 3 and the quantizer is comprised of two comparators, each having a common input that is connected to the output of the loop filter and the other inputs of which are connected to first and second quantizer threshold voltages, respectively. The comparators provide a two-bit digital output that has three states, a first state when the filtered voltage is greater than the first threshold voltage, a second state when the filtered voltage is less than the second threshold voltage and a third state when the filtered voltage is between the first and second threshold voltages. The m-level DAC is comprised of a three-level DAC that has three states, a positive charge state, a negative charge state and a "do nothing" state wherein no charge is added to the loop filter.

In a further aspect of the present invention, the delta-sigma modulator has a signal-to-quantization noise ratio that is a function of the quantizer threshold voltages. The signal-to-quantization noise ratio has an optimum value for at least one value of the quantizer threshold voltages, with the optimum for the signal-to-thermal noise ratio occurring at a different value of the quantizer threshold voltage.

In a yet further aspect of the present invention, the optimum thermal noise performance of the delta-sigma modulator is determined by selecting the quantizer threshold voltage wherein the signal-to-thermal noise ratio response is substantially maximized.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
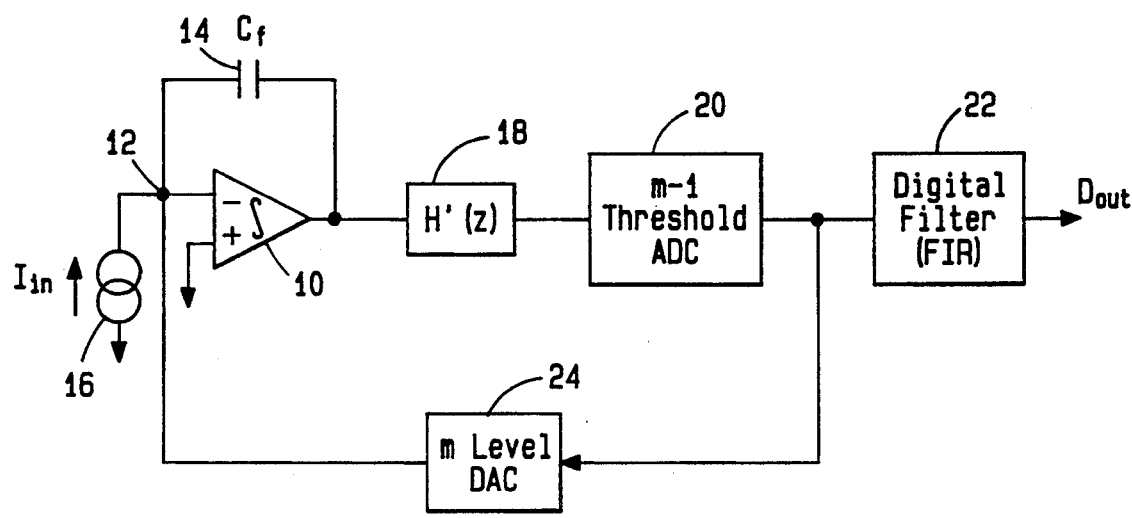
FIG. 1 illustrates a block diagram of an analog-to-digital converter utilizing an m-level DAC with an m-level output.

Referring now to FIG. 1, there is illustrated a block diagram of an analog-to-digital converter incorporating an m-level delta-sigma modulator. The delta-sigma modulator is comprised of an input integration stage 10 having a positive and an negative input, the positive input connected to ground and the negative input connected to a summing node 12. A feedback capacitor 14 is connected between the input node and the output of the integrator 10. A current source 16 provides the input to the analog-to-digital converter. However, it should be understood that a voltage input could be utilized with the addition of an input switched-capacitor. The output of the integrator 10 is connected to the input of a noise shaping circuit 18 which is typically comprised of a plurality of integrators, as will be described hereinbelow. The noise shaping circuit 18 has a transfer function H'(z). The output of the noise shaping circuit 18 is connected to an input of an (m−1)-threshold imbedded analog-to-digital converter (ADC) 20. The output of the imbedded ADC 20 is an m-level output that is input to a digital filter 22 for filtering the out of band quantization noise. This provides a digital output. Typically, the digital filter 22 is a Finite Impulse Response (FIR) filter.

The output of the imbedded ADC 20 is also connected to the control input of an m-level digital-to-analog converter (DAC) 24. The m-level DAC 24 provides three levels, $+1, 0, -1$, with the "0" level providing a "do nothing" level. The m-level DAC 24 has associated therewith a plurality of output voltages to define various feedback levels, with an additional "do nothing" output.

Figure 2:
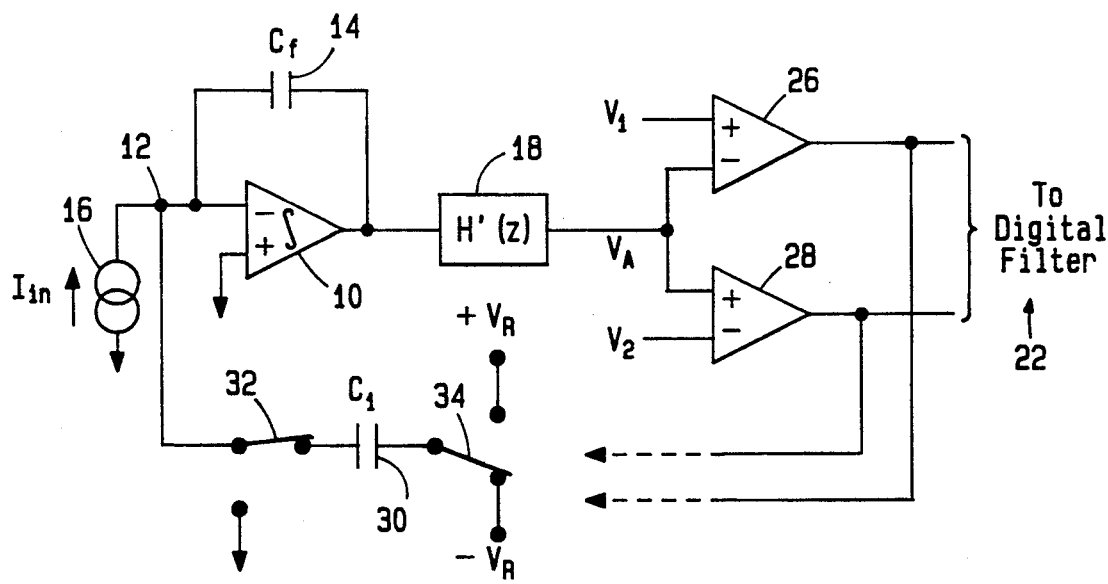
FIG. 2 illustrates a block diagram of a 3-bit delta-sigma modulator.

Referring now to FIG. 2, there is illustrated a more detailed block diagram of the delta-sigma modulator of FIG. 1 illustrating a two-bit output providing three states. The imbedded ADC 20 is comprised of two comparators, a comparator 26 and a comparator 28. The comparator 26 has the positive input thereof connected to a threshold voltage $V_1$ and the negative input thereof connected to the output of the noise shaping circuit 18. The comparator 28 has the positive input thereof connected to the output of the noise shaping circuit 18 and the negative input thereof connected to a threshold voltage $V_2$. The outputs of the two comparators 26 and 28 comprise the two bit outputs that are input to digital filter 22 and also to the DAC 24. Therefore, when the voltage $V_A$ on the output of the noise shaping circuit 18 is less than $V_1$ and greater than $V_2$, the output state is a "11" state whereas the output state when $V_A$ is greater than $V_1$ is a "01" state and the output state when $V_A$ is less than $V_2$ is a "10" state. This provides three separate states. However, the "do nothing" state is the first state wherein the output is "11".

The DAC 24 is comprised of a switched-capacitor 30 that has one terminal thereof connected to the wiper arm of a switch 32, switch 32 being connectable between ground and the input node 12. The other plate of capacitor 30 is connected to the wiper arm of a switch 34, switch 34 operable to switch between reference voltages $-V_R$ and $+V_R$. The switches are controlled such that the "do nothing" state exists whenever the switch 32 is grounded for a full sampling period. The $+1$ state exists whenever the capacitor 30 is charged with the switch 34 configured to contact the reference voltage $-V_R$ and the switch 32 grounded in a first phase of the sampling period. Then both switches 32 and 34 are switched in a second phase of the sampling period. In the $-1$ state, the capacitor is charged up by connecting switch 32 to ground and switch 34 to $+V_R$ in a first phase of the sampling period. Then switches 32 and 34 are switched in a second phase of the sampling period.

Figure 3:
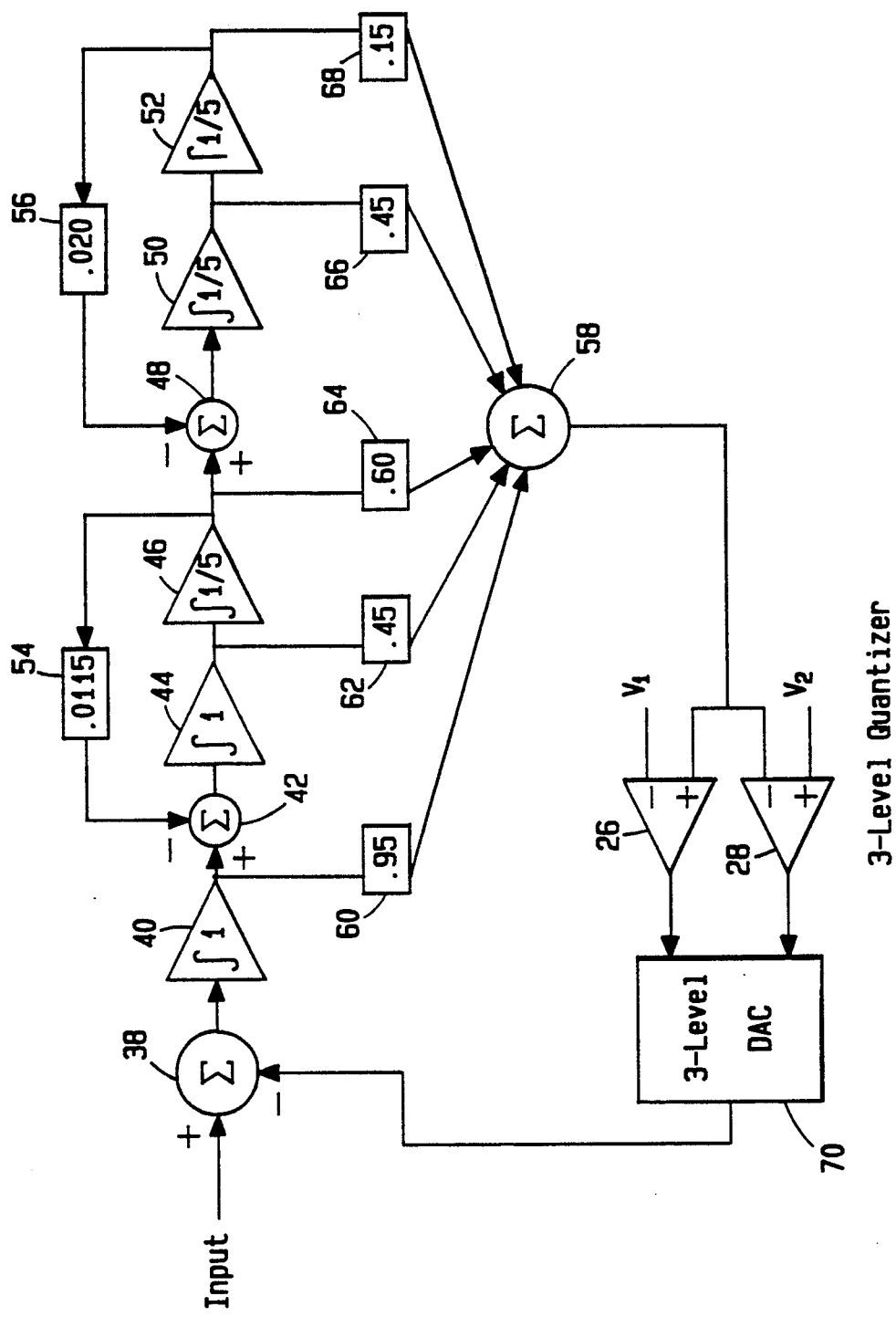
FIG. 3 illustrates a more detailed block diagram of the 3-level delta-sigma modulator utilizing a fifth order architecture.

Referring now to FIG. 3, there is illustrated a more detailed block diagram of the delta-sigma modulator of FIG. 2 illustrating the noise shaping filter 18. An input signal is provided that is fed to the positive input of a summing junction 38, the output of which is input to a first stage of integration 40. The first stage of integration 40 is comparable to the integrator 10 in FIG. 2. The integrator 40 has a gain coefficient of 1. The output of integrator 40 is input to the positive input of a summing junction 42, the output of which is connected to a second stage of integration 44, this second stage of integration 44 having a gain coefficient of 1. The output of integrator 44 is connected to the input of an integrator 46, integrator 46 having a gain coefficient of 1/5. The output of the third stage of integration 46 is input to the positive input of a summing junction 48. The output of summing junction 48 is input to the input of a fourth stage of integration 50 having a gain coefficient of 1/5. The output of the fourth stage of integration 50 is input to the input of a fifth stage of integration 52, the fifth stage of integration 52 having a gain coefficient of 1/5.

A feedback path is provided between the output of the third stage of integration 46 and the negative input of the summing junction 42, the feedback path having a feedback coefficient of 0.0115, this indicated in a feedback coefficient block 54. A feedback path is also provided between the output of the fifth stage of integration 52 and the negative input of the summing junction 48. This feedback path has a feedback coefficient of 0.020, as indicated by a feedback coefficient block 56. Feedforward coefficients are also provided between the output of each of the integration stages 40, 44, 46, 50 and 52 for input to a summing junction 58. The feedforward path between the output of the first integration stage 40 and the summing junction 58 has a feedforward coefficient of 0.95, as indicated by a feedforward coefficient box 60. The feedforward path between the output of the second integration stage 44 and the summing junction 58 has a feedforward coefficient of 0.45, as indicated by a feedforward coefficient box 62. The output of the feedforward coefficient between the output of the third stage of integration 46 and the summing junction 58 has a feedforward coefficient of 0.60, as indicated by a feedforward coefficient box 64. The feedforward path between the output of the fourth stage of integration 50 and the summing junction 58 has a feedforward coefficient of 0.45, as indicated by a feedforward coefficient box 66. The output of the feedforward path between the output of the fifth stage of integration 52 and the summing junction 58 has a feedforward coefficient of 0.15, as indicated by a feedforward coefficient box 68.

The output of the summing junction 58 is input to the three-level quantizer which is comprised of the two comparators 26 and 28, the outputs of which are connected to a three-level DAC 70. The three-level DAC 70 is generally comprised of the switched-capacitor 30 in FIG. 2. The output of the three-level DAC 70 is input to the negative input of the summing junction 38.

The circuit of FIG. 3 can be operated with normalized DAC feedback levels of "−1" and "+1" in addition to the third "do nothing" level. The analog full scale input range to the delta sigma modulator is then normalized to between "+1" and "−1". These normalized input and feedback levels are used in the simulations described hereinbelow.

Figure 4:
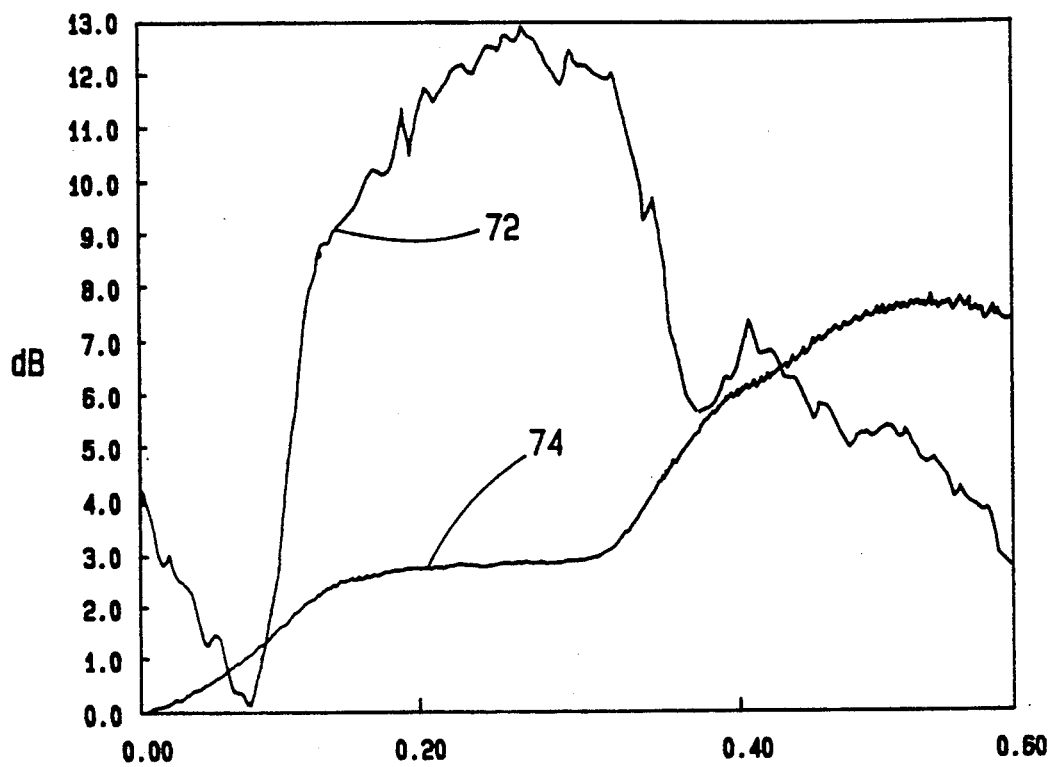
FIG. 4 illustrates the signal-to-quantization noise response and the signal-to-thermal noise response as functions of quantizer threshold voltage.

Referring now to FIG. 4, there is illustrated a simulation of the structure of FIG. 3 utilizing the feedforward coefficients, feedback coefficients and the gain coefficients in the integrators, this simulation representing two curves, a first curve 72 representing the signal-to-quantization noise ratio (SQNR) versus the quantizer threshold voltage on the x-axis and a second curve 74 representing the signal-to-thermal quantization noise ratio as a function of the quantizer threshold voltage. Since the quantization noise is relatively insignificant, it will hereinafter be referred to as the signal-to-thermal noise ratio (STNR). The quantizer threshold voltage varies from a value of "0" to a value of 0.60. It can be seen that the SQNR curve 72 is optimum around approximately 0.30 volts for the quantizer threshold voltage, it being noted that the magnitude of the quantizer threshold voltages are equal for the positive and negative threshold voltages that are utilized for a three-level quantizer. By comparison, the STNR curve 74 has the optimum signal-to-noise ratio at approximately a quantizer threshold voltage of 0.52. The difference in STNR between the quantizer threshold of 0.30 for optimum SQNR and that for optimum STNR at a quantizer threshold voltage of 0.52 is approximately 5.0 dB. As such, if the quantizer threshold voltage is chosen for optimum SQNR, a degradation in STNR will be noted. Of course, this depends on what is the dominant noise source. In high resolution analog-to-digital converters, the quantization noise is relatively low. The improvement realized with an increase of 5.0 dB in STNR is a significant improvement in these type of analog-to-digital converters. If the quantizer threshold voltage is optimized for thermal noise, the degradation in the SQNR is approximately 8.0 dB. However, degradation in SQNR of 8.0 dB is not noticeable if the absolute quantization noise level is well below the absolute thermal noise level. Therefore, a significant improvement in high-resolution analog-to-digital converter noise performance will be realized if the quantization threshold voltage is optimized for thermal noise as opposed to quantization noise. The prior art has only taught optimization for quantization noise and not optimization for thermal noise. Therefore, when the optimum noise performance as a function of the quantizer threshold voltage with respect to thermal noise favors a different quantizer threshold voltage as that compared to optimization for quantization noise, the quantizer threshold voltage can be optimized at a different point than that taught in the prior art.

In the optimization procedure of the present invention, the first step is to simulate the noise response of the delta-sigma modulator with respect to thermal noise. The STNR curve 74 will typically peak at a relatively high quantizer threshold voltage compared to that for the peak SQNR. However, after the STNR peaks, the delta-sigma modulator will go to an unstable condition. In the curve of FIG. 4 labelled 74, this unstable region will begin somewhere around 0.60 to 0.61. A quantizer threshold voltage of 0.50 to 0.54 will result in relatively optimum thermal noise performance. The program for generating the simulated response of the curve illustrated in FIG. 4 for the structure of FIG. 3 is a relatively straightforward program and, with feedforward coefficients, feedback coefficients and integrator gain coefficients, an individual skilled in the art can easily simulate the thermal noise response of any delta-sigma modulator with the addition of thermal noise sources.

Although the imbedded ADC 20 is described utilizing comparators, it could be realized with other ADC architectures such as a multi-step flash ADC. With such other architectures a reference voltage determines all of the quantizer threshold voltages. This reference voltage can then be optimized for STNR, as described above.

Figure 5:
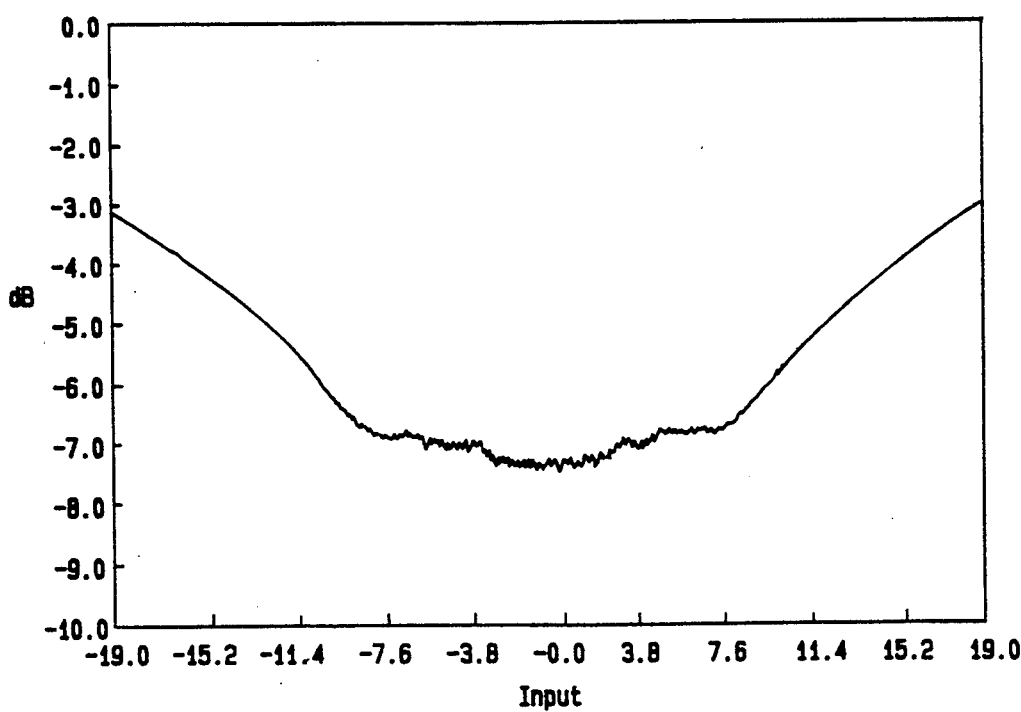
FIG. 5 illustrates the thermal noise response of a delta-sigma modulator with the quantizer threshold voltages optimized for minimal thermal noise.
Figure 6:
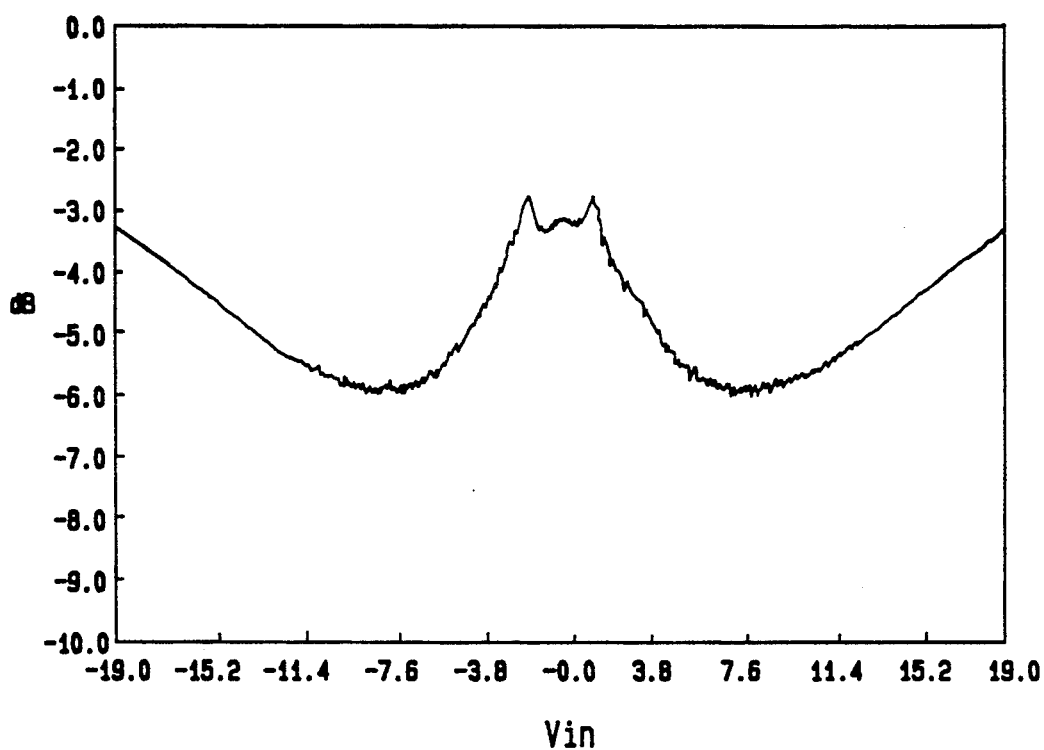
FIG. 6 illustrates the non-optimized thermal noise response of a delta-sigma modulator.

Referring now to FIG. 5, there is illustrated a plot of the noise performance of the delta-sigma modulator of FIG. 3 as a function of input level, the input level ranging from full positive scale to full negative scale, with the relative noise performance being plotted on the y-axis. This plot represents the condition when the quantizer threshold voltage is optimized for thermal noise. By comparison, FIG. 6 illustrates a similar plot wherein the quantizer threshold voltage is set to approximately 0.30, that being the quantizer threshold voltage required to optimize for quantization noise. It can be seen that at 0.0 volts there is approximately a 4 dB degradation in noise performance as compared to the thermal noise optimized curve of FIG. 5.

In summary, there has been provided an optimization method for setting the quantizer thresholds for an m-level delta-sigma modulator utilizing an m-level quantizer. The optimization method is comprised of first simulating the signal-to-thermal noise response of the delta-sigma modulator and then optimizing the noise performance thereof to provide the optimum STNR. This is compared to an optimization step wherein the SQNR is optimized. The quantization threshold voltage is then set on the m-level quantizer to provide the optimum thermal noise performance.

Although the preferred embodiment has been described in detail, it should be understood that various changes, substitutions and alterations can be made therein without departing from the spirit and scope of the invention as defined by the appended claims.

What is claimed is:

1. A low noise delta-sigma modulator for an analog-to-digital converter, comprising:
   a loop filter for receiving an input signal, said loop filter processing the difference between the input signal and a feedback DAC signal to provide a filtered signal;
   a multi-level quantizer having m-1 quantizer threshold inputs, m being a positive integer, for receiving quantizer threshold voltages, said quantizer operable to receive the output of said loop filter, and output an m-level quantizer value;
   an m-level digital-to-analog converter for receiving on the input thereof the output of said quantizer, the output thereof providing the feedback DAC signal for input to said loop filter;
   said loop filter, quantizer and digital-to-analog converter having a signal-to-thermal noise ratio that varies as a function of said quantizer threshold voltages and having an optimum value for at least one value of said quantizer threshold voltages; and
   a threshold voltage source for inputting said quantizer threshold voltages to said quantizer, said quantizer threshold voltages set to a value to provide substantially optimum signal-to-thermal noise ratio.

2. The delta-sigma modulator of claim 1 wherein said loop filter has a noise shaping response to minimize quantization noise within a frequency band of interest.

3. The delta-sigma modulator of claim 1 wherein said loop filter comprises a plurality of integration stages connected in a cascaded configuration, with select ones of the outputs of said integration stages fed back to the inputs of select ones of said integration stages with predetermined feedback coefficients and the outputs of select ones of said integration stages input to a summing junction along a feedforward path, each feedforward path having a predetermined feedforward coefficient associated therewith.

4. The delta-sigma modulator of claim 1 wherein the value of m is equal to three.

5. The delta-sigma modulator of claim 4 wherein said multi-level quantizer comprises first and second comparators each having a quantizer threshold voltage input for receiving a separate quantizer threshold voltage and both having a common input connected to the output of said loop filter, the outputs of said first and second comparators comprising a two-bit digital output having three states, one state representing the condition wherein the filtered signal is greater than the quantizer threshold voltage input to said first comparator, one state representing the state wherein the filtered signal is less than the quantizer threshold voltage input to said second comparator and a third state representing the condition wherein the filtered signal has a value between the voltage levels of said the quantizer threshold voltages input to said first and second comparators.

6. The delta-sigma modulator of claim 5 wherein said digital-to-analog converter comprises a switched-capacitor section having one plate thereof switched between two different reference voltages and the other plate thereof switched between a ground voltage and the input to said loop filter, said switched capacitor section controlled by the two-bit digital output of said first and second comparators to switch a positive charge to the input of said loop filter in response to said first state existing on the input of said quantizer, to switch a negative charge to the input of said loop filter for said second state output by said quantizer and to not switch to the input of said loop filter when said third state of said quantizer is output.

7. The delta-sigma modulator of claim 1 wherein the delta-sigma modulator has a signal-to-quantization noise ratio having an optimum for at least one value of said quantizer threshold voltages that is different than the quantizer threshold voltages corresponding to the optimum of said signal-to-thermal noise ratio.

8. The delta-sigma modulator of claim 1 wherein the optimum of said signal-to-thermal noise ratio occurs where the derivative of the thermal noise response of the delta-sigma modulator as a function of said quantizer threshold voltages is substantially zero and the level thereof is the substantial optimum value.

9. A low noise delta-sigma modulator for an analog-to-digital converter, comprising:
   a loop filter for receiving an input signal, said loop filter processing the difference between the input signal and a feedback DAC signal to provide a filtered signal;
   a multi-level quantizer having m-1 quantizer threshold inputs, m being a positive integer, for receiving quantizer threshold voltages, said quantizer operable to receive the output of said loop filter, and output an m-level quantizer value;
   an m-level digital-to-analog converter for receiving on the input thereof the output of said quantizer, the output thereof providing the feedback DAC signal for input to said loop filter;
   said loop filter, quantizer and digital-to-analog converter having a signal-to-thermal noise ratio that varies as a function of said quantizer threshold voltages and having a signal-to-quantization noise ratio that varies as a function of said quantizer threshold voltages and having an optimum value for at least one value of said quantizer threshold voltages; and
   a threshold voltage source for inputting said quantizer threshold voltages to said quantizer, said quantizer threshold voltages set to a value that is substantially different than the value of said quantizer threshold voltages corresponding to the optimum value of said signal-to-quantization noise ratio to provide a higher signal-to-thermal noise ratio than that associated with the value of the quantizer threshold voltages corresponding to the optimum signal-to-quantization noise ratio.

10. The delta-sigma modulator of claim 9 wherein said loop filter comprises a plurality of integration stages connected in a cascaded configuration, with select ones of the outputs of said integration stages fed back to the inputs of select ones of said integration stages with predetermined feedback coefficients and the outputs of select ones of said integration stages input to a summing junction along a feedforward path, each feedforward path having a predetermined feedforward coefficient associated therewith.

11. The delta-sigma modulator of claim 9 wherein the value of m is equal to three.

12. The delta-sigma modulator of claim 11 wherein said multi-level quantizer comprises first and second comparators each having a quantizer threshold voltage input for receiving a separate quantizer threshold voltage and both having a common input connected to the output of said loop filter, the outputs of said first and second comparators comprising a two-bit digital output having three states, one state representing the condition wherein the filtered signal is greater than the quantizer threshold voltage input to said first comparator, one state representing the state wherein the filtered signal is less than the quantizer threshold voltage input to said second comparator and a third state representing the condition wherein the filtered signal has a value between the voltage levels of said the quantizer threshold voltages input to said first and second comparators.

13. The delta-sigma modulator of claim 12 wherein said digital-to-analog converter comprises a switched-capacitor section having one plate thereof switched between two different reference voltages and the other plate thereof switched between a ground voltage and the input to said loop filter, said switched capacitor section controlled by the two-bit digital output of said first and second comparators to switch a positive charge to the input of said loop filter in response to said first state existing on the output of said quantizer, to switch a negative charge to the input of said loop filter for said second state output by said quantizer and to not switch to the input of said loop filter when said third state of said quantizer is output.

14. A low noise delta-sigma modulator for an analog-to-digital converter, comprising:
a loop filter for receiving an input signal, said loop filter processing the difference between the input signal and a feedback DAC signal to provide a filtered signal;
a multi-level quantizer having m-1 quantizer threshold, m being a positive integer, said quantizer operable to receive the output of said loop filter, and output an m-level quantizer value;
an m-level digital-to-analog converter for receiving on the input thereof the output of said quantizer, the output thereof providing the feedback DAC signal for input to said loop filter;
said loop filter, quantizer and digital-to-analog converter having a signal-to-thermal noise ratio that varies as a function of said quantizer threshold voltages and having an optimum value for at least one value of said quantizer threshold voltages; and
a threshold voltage source for generating a signal for controlling said quantizer threshold voltages by setting them to a value to provide substantially optimum signal-to-thermal noise ratio.

15. A method for optimizing the thermal noise performance of a delta-sigma modulator in an analog-to-digital converter, the delta-sigma modulator having a multi-level output and a quantizer with (m−1) quantizer threshold voltages, m being a positive integer greater than 2, comprising the steps of:
simulating the response of the delta-sigma modulator to determine the signal-to-thermal noise ratio as a function of the quantizer threshold voltages; and
setting the quantizer threshold voltages to a value that provides a substantially optimum signal-to-thermal noise ratio.

16. The method of claim 15 wherein the delta-sigma modulator has a signal-to-quantization noise ratio as a function of quantizer threshold voltages that has an optimum for a different value of the quantizer threshold voltage than that for the optimum signal-to-thermal noise ratio.

17. The method of claim 15 wherein the optimum for the signal-to-thermal noise ratio as a function of quantizer threshold voltage occurs when the response of the signal-to-thermal noise ratio as a function of quantizer threshold voltage has a first derivative that is substantially zero and the value thereof is at a substantial optimum level.

18. A method for optimizing the thermal noise performance of a delta-sigma modulator in an analog-to-digital converter, the delta-sigma modulator having a multi-level output and a quantizer with (m−1) quantizer threshold voltages, m being a positive integer greater than 2, and the delta-sigma having a signal-to-quantization noise ratio that has an optimum for at least one value of quantizer threshold voltages, comprising the steps of:
simulating the response of the delta-sigma modulator to determine the signal-to-thermal noise ratio as a function of the quantizer threshold voltages; and
setting the quantizer threshold voltages to a value that is substantially different than the value of the quantizer threshold voltages corresponding to the optimum value of the signal-to-quantization noise ratio to provide a higher signal-to-thermal noise ratio than that associated with the value of the quantizer threshold voltages corresponding to the optimum signal-to-quantization noise ratio.

19. A method for delta-sigma modulation having low noise characteristics, comprising the steps of:
receiving an input signal and a feedback DAC signal and performing a loop filter operation thereon to process the difference between the input signal and the feedback DAC signal to provide a filtered signal;
providing a quantizer having m-1 quantizer threshold inputs, m being a positive integer, for receiving quantizer threshold voltages, and quantizing the filtered signal to output an m-level quantizer value;
converting the m-level quantizer value to an analog value with an m-level digital-to-analog converter to provide the feedback DAC signal;
the steps of processing with the loop filter, quantizing and converting the m-level quantizer value to an analog value has associated therewith a signal-to-thermal noise ratio that varies as a function of the quantizer threshold voltages input to the quantizer threshold inputs and having an optimum value for at least one value of the quantizer threshold voltages; and inputting the quantizer threshold voltages to the quantizer, the quantizer threshold voltages set to a value to provide substantially optimum signal-to-thermal noise ratio.

20. The method of claim 19 wherein the step of processing with the loop filter comprises providing a plurality of integration stages connected in a cascaded configuration and feeding back the outputs of select ones of the integrated stages to the inputs of select other ones of the integration stages with predetermined feedback coefficients and feeding the outputs of select ones of the integration stages to a summing junction along a separate feedforward path, each feedforward path having a predetermined feedforward coefficient associated therewith.

21. The method of claim 19 wherein the value of m is equal to three.

22. The method of claim 21 wherein the step of providing the m-level quantizer comprises:

providing first and second comparators, each having a quantizer threshold input for receiving a separate quantizer threshold voltage from the step of inputting the quantizer threshold voltages; and connecting one input of each of the comparators to receive the filtered signal, the output of the first and second comparators comprising a two-bit digital output having three states, one state representing the condition wherein the filtered signal is greater than the quantizer threshold voltage input to the first comparator, one state representing the state wherein the filtered signal is less than quantizer threshold voltage input to the second comparator and a third state representing the condition wherein the filtered signal is between the values of the quantizer threshold voltages input to the first and second comparators.

23. The method of claim 19 wherein the step of processing with the loop filter, quantizing and converting the quantizer value to an analog voltage and subtracting it from the input signal has associated therewith a signal-to-quantization noise ratio that is a function of the quantizer threshold voltages and having an optimum value for at least one value of the quantizer threshold voltages, the optimum occurring for a different value of quantizer threshold voltages than that for the optimum of the signal-to-thermal noise ratio response.

24. The method of claim 19 wherein the step of determining the optimum value for the signal-to-thermal noise ratio comprises determining the point where the first derivative of the signal-to-thermal noise ratio as a function of quantizer threshold voltages is substantially equal to zero and the level thereof is at a substantial optimum.

25. A method for delta-sigma modulation having low noise characteristics, comprising the steps of:

receiving an input signal and a feedback DAC signal and performing a loop filter operation thereon to process the difference between the input signal and the feedback DAC signal to provide a filtered signal;

providing a quantizer having m−1 quantizer threshold inputs, m being a positive integer, for receiving quantizer threshold voltages, and quantizing the filtered signal to output an m-level quantizer value;

converting the m-level quantizer value to an analog value with an m-level digital-to-analog converter to provide the feedback DAC signal;

the steps of processing with the loop filter, quantizing and converting the m-level quantizer value to an analog value having associated therewith a signal-to-thermal noise ratio and a signal-to-quantization noise ratio, both varying as a function of the quantizer threshold voltages input to the quantizer threshold inputs, the signal-to-quantization noise having an optimum value for at least one value of the quantizer threshold voltages; and inputting the quantizer threshold voltages to the quantizer, the quantizer threshold voltages set to a value that is substantially different than the value of the quantizer threshold voltages corresponding to the optimum value of the signal-to-quantization noise ratio to provide a higher signal-to-thermal noise ratio than that associated with the value of the quantizer threshold voltages corresponding to the optimum signal-to-quantization noise ratio.

26. The method of claim 25 wherein the step of processing with the loop filter comprises providing a plurality of integration stages connected in a cascaded configuration and feeding back the outputs of select ones of the integrated stages to the inputs of select other ones of the integration stages with predetermined feedback coefficients and feeding the outputs of select ones of the integration stages to a summing junction along a separate feedforward path, each feedforward path having a predetermined feedforward coefficient associated therewith.

27. The method of claim 25 wherein the value of m is equal to three.

28. The method of claim 27 wherein the step of providing the m-level quantizer comprises:

providing first and second comparators, each having a quantizer threshold input for receiving a separate quantizer threshold voltage from the step of inputting the quantizer threshold voltages; and connecting one input of each of the comparators to receive the filtered signal, the output of the first and second comparators comprising a two-bit digital output having three states, one state representing the condition wherein the filtered signal is greater than the quantizer threshold voltage input to the first comparator, one state representing the state wherein the filtered signal is less than the quantizer threshold voltage input to the second comparator and a third state representing the condition wherein the filtered signal is between the values of the quantizer threshold voltages input to the first and second comparators.

* * * * *